United States Patent [19]
Buschbom

[11] Patent Number: 5,892,274
[45] Date of Patent: Apr. 6, 1999

[54] PRINTED CIRCUIT BOARD GROUND PLANE AND HIGH FREQUENCY SEMICONDUCTOR COMBINATION

[75] Inventor: Milton L. Buschbom, Plano, Tex.

[73] Assignee: Texas Instruments Incorporated, Dallas, Tex.

[21] Appl. No.: 900,243

[22] Filed: Jul. 24, 1997

[51] Int. Cl.[6] .............. H01L 23/48; H01L 39/00; H01L 29/40
[52] U.S. Cl. .............. 257/696; 257/693; 257/664; 257/662
[58] Field of Search ................... 257/696, 662, 257/664, 666, 689, 690, 693; 438/163; 361/813, 781, 748, 749

[56] References Cited

U.S. PATENT DOCUMENTS 5,639,989  6/1997  Higgins, III ............... 257/728

FOREIGN PATENT DOCUMENTS 3-265161  11/1991  Japan ................... 257/675

*Primary Examiner*—Mahshid Saadat
*Assistant Examiner*—Jhihan B. Clark
*Attorney, Agent, or Firm*—Alan K. Stewart; Wade James Brady, III; Richard L. Donaldson

[57] ABSTRACT

The invention is to a combination of a semiconductor device and a ground plane on a printed wiring board to provide a controlled impedance signal lead. A printed wiring board has a ground plane layer, and a semiconductor device having a down-set, or deep down-set, lead frame die mounting pad is mounted on the printed wiring board above the ground plane layer. The leads of the semiconductor device form a transmission line in combination with the ground plane, when the leads are placed a controlled distance above the ground plane.

4 Claims, 3 Drawing Sheets

| PIN NUMBER | IMPEDANCE PER PIN (OHMS) VERSUS STANDOFF 64 PIN TQFP, DEEP DOWNSET VERSUS LQFP STANDOFF HEIGHT (Mils) | | | | | |
|---|---|---|---|---|---|---|
| | 0 | 1 | 2 | 4 | 6 | LQFP |
| 1 | 80.33 | 81.22 | 82.11 | 83.82 | 85.34 | 105.86 |
| 2 | 73.96 | 74.70 | 75.39 | 76.57 | 77.75 | 93.04 |
| 3 | 74.50 | 75.15 | 75.87 | 77.04 | 78.14 | 93.37 |
| 4 | 75.14 | 75.80 | 76.50 | 77.69 | 78.81 | 93.99 |
| 5 | 75.65 | 76.39 | 77.02 | 78.22 | 79.32 | 94.44 |
| 6 | 77.93 | 78.70 | 79.35 | 80.59 | 81.65 | 97.00 |
| 7 | 78.87 | 79.66 | 80.33 | 81.57 | 82.63 | 98.07 |
| 8 | 80.19 | 80.89 | 81.57 | 82.84 | 84.03 | 99.74 |
| 9 | 80.09 | 80.89 | 81.57 | 82.84 | 83.93 | 99.62 |
| 10 | 78.83 | 79.51 | 80.17 | 81.42 | 82.48 | 97.91 |
| 11 | 78.10 | 78.77 | 79.53 | 80.76 | 81.82 | 97.17 |
| 12 | 75.59 | 76.24 | 76.95 | 78.15 | 79.27 | 94.38 |
| 13 | 74.95 | 75.69 | 76.32 | 77.52 | 78.62 | 93.79 |
| 14 | 74.34 | 74.99 | 75.70 | 76.88 | 77.98 | 93.20 |
| 15 | 73.81 | 74.54 | 75.24 | 76.42 | 77.52 | 92.89 |
| 16 | 80.12 | 81.03 | 82.02 | 83.62 | 85.15 | 105.66 |

| PIN NUMBER | INDUCTANCE PER PIN (nH) VERSUS STANDOFF 64 PIN TQFP, DEEP DOWNSET VERSUS LQFP STANDOFF HEIGHT (Mils) | | | | | | |
|---|---|---|---|---|---|---|---|
| | 0 | 1 | 2 | 4 | 6 | LQFP |
| 1 | 2.839 | 2.883 | 2.926 | 3.007 | 3.081 | 4.292 |
| 2 | 2.757 | 2.801 | 2.842 | 2.920 | 2.992 | 4.172 |
| 3 | 2.703 | 2.745 | 2.786 | 2.861 | 2.931 | 4.080 |
| 4 | 2.665 | 2.706 | 2.745 | 2.819 | 2.888 | 4.011 |
| 5 | 2.644 | 2.684 | 2.723 | 2.796 | 2.863 | 3.969 |
| 6 | 2.557 | 2.595 | 2.632 | 2.702 | 2.767 | 3.820 |
| 7 | 2.563 | 2.602 | 2.639 | 2.708 | 2.772 | 3.818 |
| 8 | 2.540 | 2.578 | 2.615 | 2.683 | 2.747 | 3.780 |
| 9 | 2.540 | 2.578 | 2.615 | 2.683 | 2.747 | 3.781 |
| 10 | 2.554 | 2.592 | 2.629 | 2.698 | 2.762 | 3.806 |
| 11 | 2.574 | 2.612 | 2.650 | 2.720 | 2.785 | 3.843 |
| 12 | 2.634 | 2.674 | 2.712 | 2.785 | 2.853 | 3.955 |
| 13 | 2.646 | 2.687 | 2.726 | 2.800 | 2.868 | 3.985 |
| 14 | 2.680 | 2.722 | 2.762 | 2.837 | 2.907 | 4.048 |
| 15 | 2.735 | 2.778 | 2.819 | 2.897 | 2.969 | 4.142 |
| 16 | 2.818 | 2.863 | 2.906 | 2.986 | 3.060 | 4.265 |

FIG. 9

| PIN NUMBER | CAPACITANCE PER PIN (pf) VERSUS STANDOFF 64 PIN TQFP, DEEP DOWNSET VERSUS LQFP STANDOFF HEIGHT (Mils) | | | | | | |
|---|---|---|---|---|---|---|---|
| | 0 | 1 | 2 | 4 | 6 | LQFP |
| 1 | 0.440 | 0.437 | 0.434 | 0.428 | 0.423 | 0.383 |
| 2 | 0.504 | 0.502 | 0.500 | 0.498 | 0.495 | 0.482 |
| 3 | 0.487 | 0.486 | 0.484 | 0.482 | 0.480 | 0.468 |
| 4 | 0.472 | 0.471 | 0.469 | 0.467 | 0.465 | 0.454 |
| 5 | 0.462 | 0.460 | 0.459 | 0.457 | 0.455 | 0.445 |
| 6 | 0.421 | 0.419 | 0.418 | 0.416 | 0.415 | 0.406 |
| 7 | 0.412 | 0.410 | 0.409 | 0.407 | 0.406 | 0.397 |
| 8 | 0.395 | 0.394 | 0.393 | 0.391 | 0.389 | 0.380 |
| 9 | 0.396 | 0.394 | 0.393 | 0.391 | 0.390 | 0.381 |
| 10 | 0.411 | 0.410 | 0.409 | 0.407 | 0.406 | 0.397 |
| 11 | 0.422 | 0.421 | 0.419 | 0.417 | 0.416 | 0.407 |
| 12 | 0.461 | 0.460 | 0.458 | 0.456 | 0.454 | 0.444 |
| 13 | 0.471 | 0.469 | 0.468 | 0.466 | 0.464 | 0.453 |
| 14 | 0.485 | 0.484 | 0.482 | 0.480 | 0.478 | 0.466 |
| 15 | 0.502 | 0.500 | 0.498 | 0.496 | 0.494 | 0.480 |
| 16 | 0.439 | 0.436 | 0.432 | 0.427 | 0.422 | 0.382 |

FIG. 8

PRINTED CIRCUIT BOARD GROUND PLANE AND HIGH FREQUENCY SEMICONDUCTOR COMBINATION

FIELD OF THE INVENTION

This invention relates to semiconductor devices, and more particularly to the combination of a high frequency semiconductor device and a printed circuit board ground plane.

BACKGROUND OF THE INVENTION

It is necessary to provide a transmission line signal path when mounting high frequency semiconductors on a printed circuit board. This is especially true when using conventional, low cost plastic semiconductor packages. It is also necessary to provide adequate heat dissipation when the semiconductor is a high frequency power device.

In an effort to meet these needs, and to reduce the size of semiconductor devices, a down set, or deep down set die pad lead frame has been utilized to provide thinner packages and to eliminate the need for heat sinks and heat spreaders. In the "Deep Down set" lead frame/package, the die pad of the lead frame is down set, or up-set, and the side of the die pad opposite the side on which the semiconductor die is mounted is exposed at the external surface of the semiconductor package.

SUMMARY OF THE INVENTION

The invention is to a combination of a semiconductor device and a ground plane on a printed wiring board to provide a controlled resistance signal lead. A printed wiring board has a ground plane layer, and a semiconductor device having a down-set or deep down set lead frame die mounting pad is mounted on the printed wiring board above the ground plane layer. The leads of the semiconductor device form a transmission line in combination with the ground plane, when the leads are placed a controlled distance above the ground plane.

The technical advance represented by the invention, as well as the objects thereof, will become apparent from the following description of a preferred embodiment of the invention when considered in conjunction with the accompanying drawings, and the novel features set forth in the appended claims.

BRIEF DESCRIPTION OF THE DRAWINGS

FIG. 8 shows capacitance per pin vs device standoff height above the ground plane; and FIG. 9 shows inductance per pin vs device lead standoff height above the ground plane.

DESCRIPTION OF A PREFERRED EMBODIMENT

Figure 1:
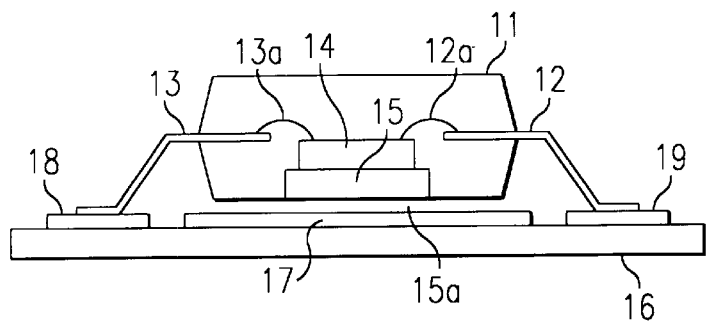
FIG. 1 is a semiconductor device with an exposed surface deep down set lead frame die pad mounted on a printed circuit board over a ground plane.

FIG. 1 show an embodiment of the invention showing a semiconductor device 11 mounted on a printed wiring board 16. Device 11 is has a semiconductor die 14 mounted on a deep down set lead frame die pad 15 with an exposed surface 15a at the surface of device 11. Two leads 12 and 13, of a plurality of leads, are connected to semiconductor die 14 with bond wires 12a and 13a internal to device 11, and are connected externally to printed circuit conductors 18 and 19 on printed wiring board 16. Positioned under device 11 is ground plane 17. Ground plane 17 has a surface area slightly smaller than the area of the side of device 11 adjacent to ground plane 17.

The purpose of ground plane 17 is to provide a ground reference plane for the signal leads (12, 13) and wires (12a,13a) within the plastic package of device 11 for creation of a transmission line for the signal lead with a reduced total inductance (combined self and mutual inductance). Ground plane 17 is connected to the printed wiring board ground.

The effective electrical impedance of the transmission line, formed by the device signal leads) is controlled by the elevation of the internal package leads (as represented by 12, 12a, 13 and 13a) above the ground plane 17, the geometry of the signals leads and wires within the package, and by the materials between ground plane 17 and the internal signal leads.

The use of the deep down-set die pad exposed at the surface of the device provides an electrical connection to the ground plane, provides a low inductance path to the printed wiring board ground, and also provides a good thermal path to the printed wiring board.

Figure 2:
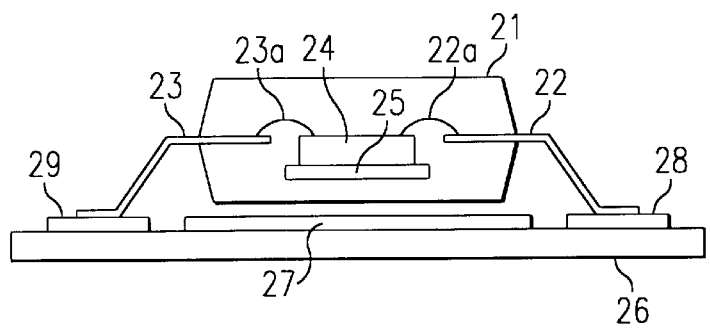
FIG. 2 is a semiconductor device with an embedded down set lead frame die pad mounted on a printed circuit board over a ground plane.

FIG. 2 is another embodiment of the invention. FIG. 2 shows a semiconductor device 21 having a semiconductor die 24 mounted on a down set lead frame die pad 25. Device lead 22 is connected to semiconductor die 24 by bond wire 22a on one end and is connected to printed wiring board conductor 28 on the other end. Similarly, device lead 23 is connected to semiconductor die 24 by bond wire 23a on one end and to printed wiring board conductor 29 on the other end. Ground plane 27 on printed wiring board 26 is positioned under semiconductor device 21.

In this embodiment, down set lead frame die pad 25 is not exposed at the surface of device 21.

Figure 3:
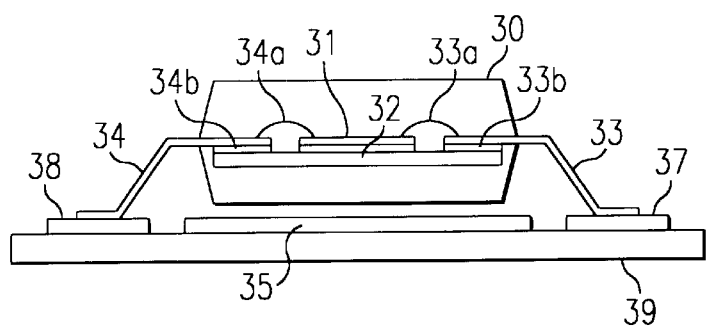
FIG. 3 a semiconductor device with a heat spreader on which the leads are mounted on a ground plane.

FIG. 3 is another embodiment of the invention utilizing a semiconductor device 30 with semiconductor die 31 mounted on a heat slug 32. Device 30 includes lead 33 attached to semiconductor die 31 via bond wire 33a. Lead 33 is attached to printed wiring board 39 via conductor 37. Similarly, lead 34 is connected to semiconductor die 31 via bond wire 34a, and lead 34 is connected to printed wiring board 39 via conductor 38. Ground plane 35, on printed wiring board 39, is positioned under semiconductor device 30. Lead 33 is mounted on heat spreader 32, but is insulated therefrom by an adhesive/insulator 33b, and lead 34 is mounted heat spreader 32, but insulated therefrom by adhesive/insulator 34b.

Figure 4:
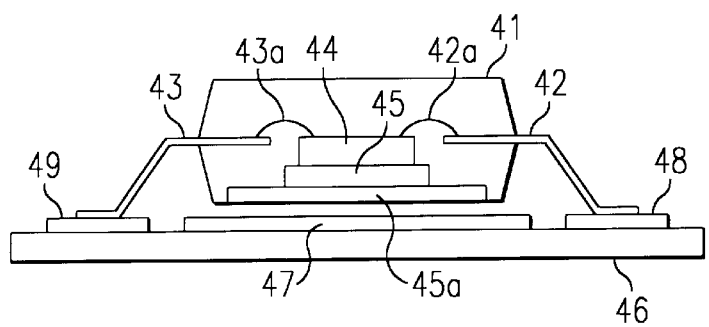
FIG. 4 is a semiconductor device which includes a heat slug spaced from the device leads, and has an exposed surface mounted on a ground plane.

FIG. 4 shows a semiconductor device 41 having a semiconductor die 44 mounted on a down set lead frame die pad 45. Device lead 42 is connected to semiconductor die 44 by bond wire 42a on one end and is connected to printed wiring board conductor 48 on the other end. Similarly, device lead 43 is connected to semiconductor die 44 by bond wire 43a on one end and to printed wiring board conductor 49 on the other end. Ground plane 47 on printed wiring board 46 is positioned under semiconductor device 41. Down set die pad 45 is mounted on a heat slug 45a, which has an exposed surface at the surface of semiconductor device 41 adjacent to ground plane 47.

Figure 5:
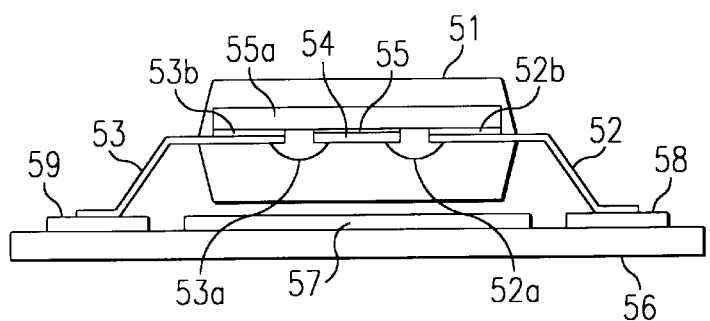
FIG. 5 is a semiconductor device similar to the device in FIG. 2 with the heat spreader mounted on the opposite side of the device from the ground plane, and the heat spreader is not exposed at the surface of the device.

FIG. 5 is another embodiment of the invention. FIG. 5 shows a semiconductor device 51 having a semiconductor 54 die mounted on an "up-set" lead frame die pad 55 mounted of heat spreader 55a. Device lead 52 is connected to semiconductor die 54 by bond wire 52a on one end and is connected to printed wiring board conductor 58 on the other end. Similarly, device lead 53 is connected to semiconductor die 54 by bond wire 53a on one end, and to printed wiring board conductor 59 on the other end. Lead 52 is mounted on heat spreader 55a, but is insulated therefrom by an adhesive/insulator 52b, and lead 53 is mounted heat spreader 55a, but insulated therefrom by adhesive/insulator 53b. Ground plane 57 on printed wiring board 56 is positioned under semiconductor device 51.

Figures 6, 7:
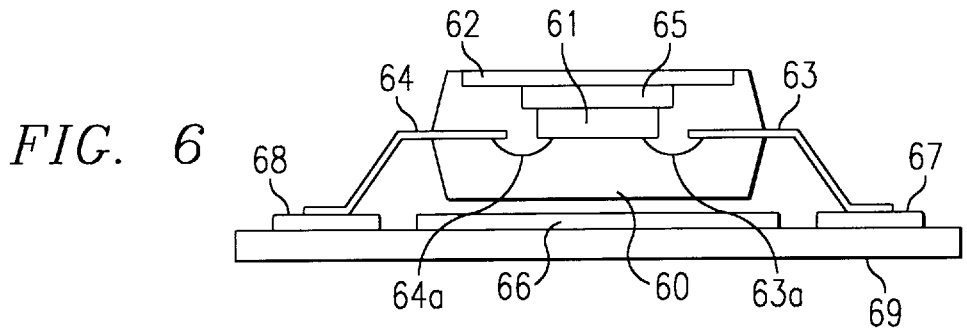
FIG. 6 is a semiconductor device similar to FIG. 4 with the exposed heat slug surface on the opposite side of the device from the ground plane.
FIG. 7 shows impedance per pin vs device lead standoff height above the ground plane.

FIG. 6 is another embodiment of the invention utilizing a semiconductor device 60 with semiconductor die 61 mounted on an upset die pad 65 mounted on heat slug 62 that extends to the surface of device 60. Device 60 includes lead 63 attached to semiconductor die 61 via bond wire 63a. Lead 63 is attached to printed wiring board 69 via conductor 67. Similarly, lead 64 is connected to semiconductor die 61 via bond wire 64a, and lead 64 is connected to printed wiring board 69 via conductor 68. Ground plane 66, on printed wiring board 69, is positioned under semiconductor device 60. Whereas in the embodiments of FIGS. 1–4, there is a down set in the die mounting pad, in FIG. 6, the die mount pad is "Up-set" mounting semiconductor die in an inverted position.

FIG. 7 shows the impedance per pin for one side, for example, of a 64 pin TQFP semiconductor device. Each device is approximately 1 millimeter thick. The impedance per pin is measured for stand-off heights of 0, 1, 2 4 and 6 millimeter, and is compared with the impedance per pin of a LQFP device having a thickness of 1.4 mil. The stand-off height is the distance from the ground plane to the bottom of the semiconductor device. The leads and bond wires within the device are centered at one-half the device thickness.

Impedance is determined by:

$$Imp = \sqrt{L/C}$$

The impedance for the device/ground plane of the present invention ranges from a low of 73.96 ohms to about 80.33 ohms for the 0 stand off dimension. This is considerably lower than the corresponding values for the LQFP device where the leads and bond wires are a greater distance from the ground plane as determined by the device thickness FIG. 8 is a tabulation of the capacitance per pin (pf) for various stand-off heights vs the corresponding capacitance per pin for, for example, a 64 pin LQFP device.

FIG. 9 is a tabulation of the inductance per pin (nH) for various stand-off heights vs the corresponding inductance per pin for, for example, a 64 pin LQFP device.

The examples described have been 64 pin devices, however, the principle of the invention is not limited to 64 pin devices.

What is claimed:

1. The combination of a semiconductor device with a ground plane on a printed wiring board, comprising:
   a printed wiring board having a ground plane layer on a surface of the printed wiring board;
   a lead frame die mounting pad spaced apart from the printed wiring board directly above the ground plane layer;
   a semiconductor die mounted on the lead frame die mounting pad;
   leads connecting the semiconductor die to the printed wiring board; and
   a portion of each of the leads which extends out from the semiconductor die is spaced from the ground plane to form a transmission line in combination with the ground plane.

2. The combination according to claim 1, wherein the lead frame die mounting pad is between the semiconductor die and the printed wiring board.

3. The combination according to claim 1, including a heat spreader adjacent to the lead frame die mounting pad.

4. The combination according to claim 1, wherein said semiconductor die is between the lead frame die mounting pad and the printed wiring board.

* * * * *